United States Patent
Fu et al.

(10) Patent No.: US 10,121,671 B2
(45) Date of Patent: Nov. 6, 2018

(54) METHODS OF DEPOSITING METAL FILMS USING METAL OXYHALIDE PRECURSORS

(71) Applicant: Applied Materials, Inc., Santa Clara, CA (US)

(72) Inventors: Xinyu Fu, Pleasanton, CA (US); David Knapp, Santa Clara, CA (US); David Thompson, San Jose, CA (US); Jeffrey W. Anthis, San Jose, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/234,448

(22) Filed: Aug. 11, 2016

(65) Prior Publication Data

US 2017/0062224 A1    Mar. 2, 2017

Related U.S. Application Data

(60) Provisional application No. 62/211,407, filed on Aug. 28, 2015.

(51) Int. Cl.
| | | |
|---|---|---|
| *H01L 21/44* | (2006.01) | |
| *H01L 21/285* | (2006.01) | |
| *C23C 16/08* | (2006.01) | |
| *C23C 16/455* | (2006.01) | |
| *C23C 16/06* | (2006.01) | |
| *H01L 29/786* | (2006.01) | |

(52) U.S. Cl.
CPC ........ *H01L 21/28562* (2013.01); *C23C 16/06* (2013.01); *C23C 16/08* (2013.01); *C23C 16/45527* (2013.01); *C23C 16/45553* (2013.01); *H01L 21/28556* (2013.01); *H01L 29/7869* (2013.01)

(58) Field of Classification Search
CPC ......... H01L 21/28556; H01L 21/28562; H01L 21/76876; H01L 29/7869
See application file for complete search history.

(56) References Cited

U.S. PATENT DOCUMENTS

| | | | |
|---|---|---|---|
| 4,617,237 A | 10/1986 | Gupta et al. | |
| 4,668,528 A | 5/1987 | Ehrlich et al. | |
| 7,307,772 B2 | 12/2007 | Garg et al. | |
| 7,338,900 B2 | 3/2008 | Mizuno et al. | |
| 7,771,533 B2 | 8/2010 | Tois et al. | |
| 7,771,534 B2 | 8/2010 | Tois et al. | |
| 8,501,637 B2 | 8/2013 | Matero et al. | |
| 2004/0014306 A1* | 1/2004 | Komatsu | H01L 21/28079 438/585 |
| 2005/0221625 A1* | 10/2005 | Mizuno | C23C 16/34 438/775 |
| 2010/0184294 A1* | 7/2010 | Park | H01L 21/28556 438/694 |
| 2011/0281379 A1* | 11/2011 | Yang | H01L 21/02071 438/16 |

FOREIGN PATENT DOCUMENTS

WO    2000/07954 A1    2/2000

\* cited by examiner

*Primary Examiner* — Jaehwan Oh
*Assistant Examiner* — John M Parker
(74) *Attorney, Agent, or Firm* — Servilla Whitney LLC

(57) ABSTRACT

Processing methods comprising exposing a substrate to an optional nucleation promoter followed by sequential exposure of a first reactive gas comprising a metal oxyhalide compound and a second reactive gas to form a metal film on the substrate.

20 Claims, 2 Drawing Sheets

METHODS OF DEPOSITING METAL FILMS USING METAL OXYHALIDE PRECURSORS

CROSS-REFERENCE TO RELATED APPLICATIONS

This application claims priority to U.S. Provisional Application No. 62/211,407, filed Aug. 28, 2015, the entire disclosure of which is hereby incorporated by reference herein.

FIELD

Embodiments of the disclosure relate to the processing of semiconductor substrates. More particularly, embodiments of the disclosure relate to methods for the deposition of metal films on semiconductor substrates using metal oxychloride precursors.

BACKGROUND

Chemical vapor deposition (CVD) is one of the most common deposition processes employed for depositing layers on a substrate. CVD is a flux-dependent deposition technique that uses precise control of the substrate temperature and the precursors introduced into the processing chamber in order to produce a layer of uniform thickness. These requirements become more critical as substrate size increases, creating a need for more complexity in chamber design and gas flow techniques to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Deposition by CVD or ALD, amongst other techniques, uses solid or liquid precursors that sublimated or evaporated for introduction in to the processing chamber. The amount of time required for precursor saturation is a potentially rate-limiting component of the deposition process. Elevated temperatures can be used to decrease the time needed to reach saturation. However, many precursors have poor stability at elevated temperatures. Additionally, many precursors can act as aggressive stainless steel etchants, causing damage to the processing chamber components. Therefore, there is a need in the art for improved precursors for the deposition of metal films. SUMMARY One or more embodiments of the disclosure are directed to processing methods comprising exposing a substrate to a first reactive gas and a second reactive gas to deposit a metal film on the substrate. The first reactive gas comprises a metal oxyhalide. The metal film has a resistivity less than 200 $\mu\Omega$-cm and a metal content greater than 50 atomic percent.

Additional embodiments of the disclosure are directed to processing methods comprising positioning a substrate having a dielectric surface in a processing chamber and sequentially exposing at least a portion of the substrate to a first reactive gas and a second reactive gas to form a tungsten film. The first reactive gas comprises a tungsten oxyhalide and the second reactive gas comprises hydrogen.

Further embodiments of the disclosure are directed to processing methods comprising positioning a substrate having a dielectric surface in a processing chamber. The dielectric surface is treated with a nucleation promoter selected from the group consisting of trialkylaluminum, trialkylgallium, trialkylindium, disilane, trisilane, tetrasilane, diethylsilane, derivatives thereof and combinations thereof. At least a portion of the treated dielectric surface is sequentially exposed to a first reactive gas and a second reactive gas to form a tungsten film. The first reactive gas comprises tungsten oxychloride and substantially no fluorine and the second reactive gas comprises hydrogen.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 2 shows a graph of the film thickness of samples prepared in accordance with one or more embodiment of the disclosure; and.

DETAILED DESCRIPTION

Figure 1:
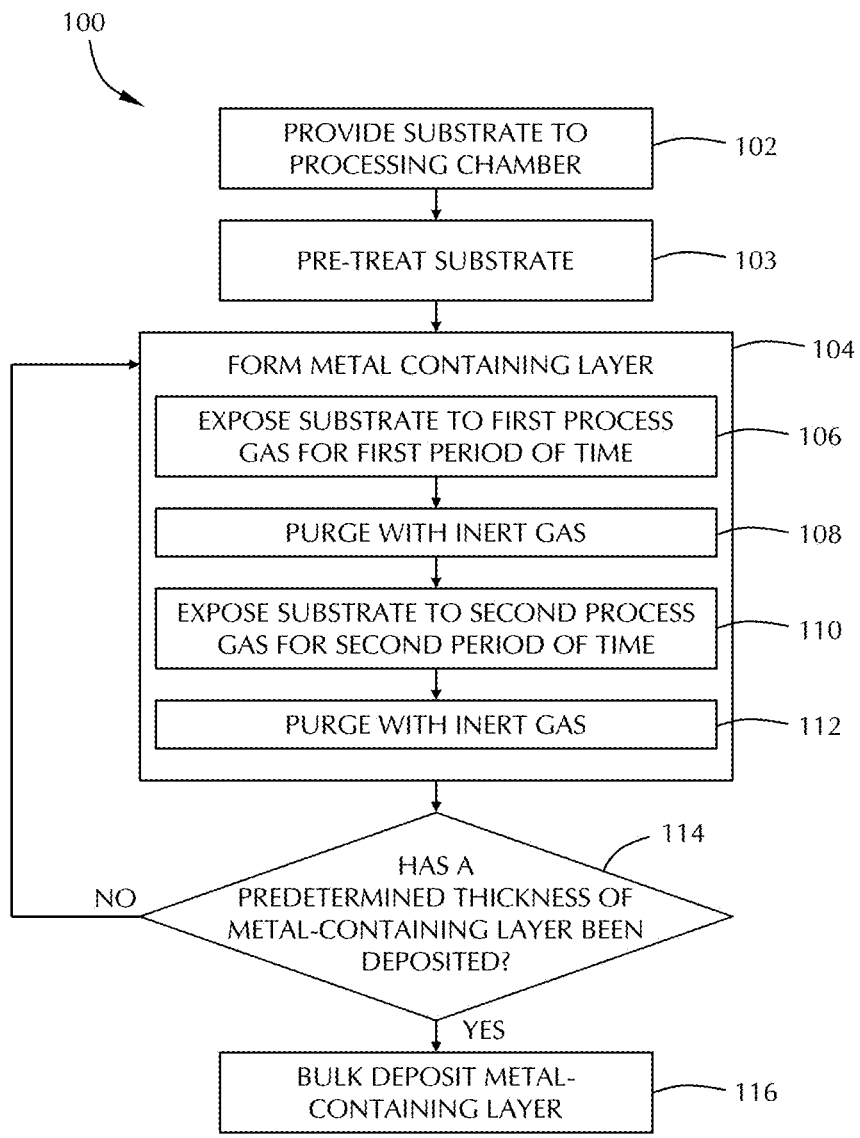
FIG. 1 illustrates an exemplary process sequence for the formation of a tungsten layer using a two pulse cyclical deposition technique according to one or more embodiment of the disclosure.

Embodiments of the disclosure provide an improved process for depositing metal-containing films using metal oxychloride precursors. The process of various embodiments uses vapor deposition techniques, such as an atomic layer deposition (ALD) to deposit metal and/or metal-containing films. In some embodiments, the metal oxychloride precursors advantageously reach saturation faster than conventional precursors. In one or more embodiments, the faster saturation allows faster process chamber cycle times. In some embodiments, the metal oxychloride precursors are more stable than similar metal halide precursors. In one or more embodiments, the metal oxychloride precursors are less aggressive etchant to the stainless steel components of the processing chamber than conventional metal chloride precursors. In some embodiments, ampoules containing the metal oxychloride precursor demonstrate less process variation from ampoule to ampoule.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as, rectangular or square panes. In some embodiments, the substrate comprises a rigid discrete material.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction).

Chemical vapor deposition (CVD) as used herein refers to a process in which a layer is deposited onto a substrate surface using gas phase reactions of two or more chemical species. The two or more chemical species can be mixed prior to entering the processing region of the processing chamber or kept separate until flowing into the processing region.

"Atomic layer deposition" or "cyclical deposition" as used herein refers to the sequential exposure of two or more reactive compounds to deposit a layer of material on a substrate surface. The substrate or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zones but are separated by an inert gas curtain and/or a vacuum curtain. The substrate is moved relative to the gas delivery apparatus so that any given point on the substrate is exposed to the first reactive gas and the second reactive gas.

Embodiments of the disclosure are described with respect to the formation of a tungsten-containing layer. This is merely for descriptive purposes and those skilled in the art will understand that the embodiments are not limited to tungsten.

FIG. 1 depicts a method for forming a metal-containing layer, or film, on a substrate in accordance with some embodiments of the disclosure. The method 100 generally begins at 102, where a substrate, having a surface upon which a metal-containing layer (e.g., a tungsten-containing layer) is to be formed is provided and placed into a processing chamber. As used herein, a "substrate surface" refers to any substrate surface upon which a layer may be formed. The substrate surface may have one or more features formed therein, one or more layers formed thereon, and combinations thereof.

The substrate may be exposed to a pre-treatment process at 103 prior to beginning the formation of the metal-containing film. The pre-treatment process of some embodiments comprises exposing the substrate to a nucleation promoter. The nucleation promoter can be any suitable compound that can treat the surface of the substrate to increase the nucleation of the metal film being formed. As used in this regard, increasing nucleation means that the nucleation rate of the metal film on the treated substrate is at least twice that of an untreated substrate. In some embodiments, the nucleation promoter is selected from the group consisting of trimethylaluminum, disilane, trisilane, tetrasilane, diethylsilane, derivatives thereof and combinations thereof. In one or more embodiments, the nucleation promoter comprises one or more of a trialkyaluminum (e.g., trimethylaluminum, triethylaluminum, ethyldimethylaluminum, etc), trialkylgallium (e.g., trimethylgallium, triethylgallium, etc.), trialkylindium (e.g., trimethylindium, triethylindium, etc.) disilane, trisilane and/or tetrasilane.

Without being bound to any particular theory of operation, it is believed that the nucleation promoter treats the substrate surface to reduce the amount of oxide, or other blocking substituent, on the surface of the substrate. As the nucleation promoter allows the formation of a film, the nucleation promoter may be analogous to or act like a seed layer. The "seed layer" of some embodiments does not form a continuous film on the substrate. Stated differently, the nucleation promotor may act like a seed layer for the formation of the metal-containing (e.g., tungsten-containing) film while being discontinuous. The average thickness of the seed layer is generally less than or equal to about 2.5 Å, 2.0 Å, 1.5 Å, 1.0 Å or 0.8 Å. As the seed layer is often discontinuous, there will likely be portions of the substrate surface that have no seed layer, and domains with a seed layer greater than 2.5 Å.

The nucleation promoter can be exposed to the substrate surface in pulses or as a soak. A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds. A "soak" as used herein refers to exposing the surface to a relatively long pulse or continuous flow of the nucleation promoter.

The process chamber may be purged of any unreacted or unused nucleation promotor. Such a purge would be similar to that described below with respect to 108. However, in some embodiments, the flow of the nucleation promotor is simply stopped prior to, with, or after, the onset of the film formation at 104.

Next, at 104, a metal layer, referred to in the Figure as a tungsten layer is formed on the substrate. Again, the use of a tungsten layer is for descriptive purposes and is merely representative of some embodiments of the disclosure. The disclosure is not limited to tungsten materials. The metal layer may be formed via a chemical vapor deposition (CVD) process or a cyclical deposition process, such as atomic layer deposition (ALD), or the like. The CVD process provides or creates a mixture of the first reactive gas and the second reactive gas in the processing chamber. There are no intervening purges between the reactions of the first and second reactive gases. For descriptive purposes, an ALD process is described in FIG. 1 and herein. Those skilled in the art will understand that the CVD process is included in this disclosure.

In some embodiments, the forming of a metal layer via a cyclical deposition process may generally comprise exposing the substrate to two or more process gases sequentially. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases. The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any of the embodiments described, the sequences may be repeated until a desired layer thickness is formed on the substrate surface.

The process of forming the metal layer at 104 may begin by exposing the substrate to a first reactive gas comprising a metal-containing compound. The flowchart of FIG. 1 refers to a first process gas and second process gas. As used herein, the terms "reactive gas", "process gas", "precursor", and the like, are used interchangeably. In some embodiments, the metal-containing compound in the first reactive gas comprises a tungsten-containing compound and is exposed to the substrate for a first period of time, as shown at 106. In one or more embodiments, the metal-containing compound in the first reactive gas comprises one or more of tungsten, molybdenum, niobium, vanadium and/or chromium.

In some embodiments, the metal-containing precursor comprises a metal oxyhalide compound having the general formula $MO_yX_z$, where X is a halogen. In some embodiments, the metal oxyhalide is one or more of an oxychloride, oxybromide, oxyiodide, oxybromochloride, oxybromoiodide, oxychloroiodide and/or oxybromochloroiodide compound. In one or more embodiments, the metal oxyhalide comprises substantially only a metal oxychloride. As used in this regard, "substantially only" means that the total halogen atom content is greater than or equal to about 95 atomic % chloride. It will be understood by those skilled in the art that the term "substantially only" used in this manner can refer to bromides or iodides or mixed halogenated species. In a mixed halogenated species, the sum of the named halogens is greater than or equal to about 95 atomic % of the total halogen.

In some embodiments, the metal oxyhalide comprises an oxychloride compound comprising one or more of $WO_yCl_z$, $MbO_yCl_z$, $NbO_yCl_z$, $VO_yCl_z$ and/or $CrO_yCl_z$, where y and z are determined based on the oxidation state of the metal species, as will be understood by those skilled in the art. For example, tungsten (VII) oxychloride might have the formula $WOCl_5$, where a tungsten (V) oxychloride might have the formula $WOCl_3$. In one or more embodiments, the metal oxyhalide is an oxybromide comprising one or more of $WO_yBr_z$, $MbO_yBr_z$, $NbO_yBr_z$, $VO_yBr_z$ and/or $CrO_yBr_z$, where y and z are determined based on the oxidation state of the metal species as will be understood by those skilled in the art. In one or more embodiments, the metal oxyhalide is an oxyiodide comprising one or more of $WO_yI_z$, $MbO_yI_z$, $NbO_yI_z$, $VO_yI_z$ and/or $CrO_yI_z$, where y and z are determined based on the oxidation state of the metal species as will be understood by those skilled in the art. In one or more embodiments, the metal oxyhalide is an oxybromochloroiodide comprising a compound having the empirical formula $MO_yBr_zCl_vI_w$, where M is one or more of W, Mb, Nb, V and/or Cr, and where each of y, z, v and w are independently in the range of 0 and 8 based on the oxidation state of the metal species as will be understood by those skilled in the art.

The metal-containing precursor can have any suitable metal for deposition on the substrate surface. In some embodiments, the first reactive gas comprises a metal that does not nucleate on a dielectric material without use of a nucleation promoter. As used in this specification and the appended claims, the term "does not nucleate" means that the nucleation rate on a dielectric surface not exposed to the nucleation promoter is less than half the nucleation rate on a treated surface. In some embodiments, the metal-containing compound, or the tungsten-containing compound, comprises substantially no fluorine. As used in this specification and the appended claims, the term "substantially no fluorine", and the like, means that there is less than about 5%, 4%, 3%, 2%, 1%, 0.5% or 0.1% fluorine atoms on an atomic basis.

In one or more embodiments, the metal-containing precursor composition changes during deposition. For example, in some embodiments, the first few cycles use a metal oxychloride precursor. After a predetermined thickness of metal has been deposited, the metal precursor can be changed to a metal halide or a mixture of metal oxyhalide and metal halide. For example, the first 25 Å of a tungsten film is deposited with tungsten oxychloride. After the initial thickness is deposited, the metal precursor is changed to tungsten pentachloride. The change can be gradual so that a mixture of oxychloride and pentachloride are used or abruptly so that only the pentachloride is used.

In some embodiments, an inert gas may additionally be provided to the process chamber at the same time as the metal-containing gas. The inert gas may be mixed with the metal-containing gas (e.g., as a diluent gas) or separately and can be pulsed or of a constant flow.

In some embodiments, the nucleation promoter is provided into the processing chamber with the first reactive gas instead of, or in addition to, the separate pre-treatment process of 103. If the nucleation promoter is provided with the first reactive gas, it may only be included for up to about the 15th process cycle.

Next, at 108, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 106. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased.

The flow of inert gas may facilitate removing any excess first process gas components and/or excess reaction byproducts from the process chamber to prevent unwanted gas phase reactions of the first and second process gases. For example, the flow of inert gas may remove excess tungsten-containing gas from the process chamber, preventing a reaction between the tungsten precursor and a subsequent reactive gas.

Next, at 110, the substrate is exposed to a second process gas, also referred to as a second reactive gas, for a second period of time. The second process gas reacts with the metal-containing compound on the substrate surface to create a deposited film. In some embodiments, the second reactive gas comprises hydrogen and the resulting film formed is a metal film (e.g., a tungsten film). In some embodiments, the second reactive gas comprises a hydrogen-containing compound and the hydrogen-containing compound consists essentially of molecular hydrogen. As used in this regard, the term "consists essentially of molecular hydrogen" means that active portion (i.e., non-inert species) of the second reactive gas is greater than or equal to about 95%, 98%, 99% or 99.5% hydrogen. As used in this regard, "molecular hydrogen" comprises one or more of $H_2$, radicals of hydrogen and/or hydrogen ions.

In some embodiments, the second reactive gas comprises a nitrogen-containing compound. Suitable nitrogen-containing compounds include, but are not limited to, nitrogen, nitrogen ions, nitrogen radicals, ammonia, hydrazine and combination thereof. In some embodiments, the nitrogen-containing compound forms a metal nitride layer on the substrate. For example, if the first reactive gas comprises a tungsten oxychloride and the second reactive gas comprises ammonia, a tungsten nitride film may be formed.

Next, at 112, the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased.

While the generic embodiment of the processing method shown in FIG. 1 includes only two pulses of reactive gases, those skilled in the art will understand that this is merely exemplary and that additional pulses of reactive gases may be used. For example, a nitride film of some embodiments can be grown by a first pulse containing a precursor gas like tungsten oxychloride, a second pulse with a reducing agent followed by purging and a third pulse for nitridation. The pulses can be repeated in their entirety or in part. For example all three pulses could be repeated or only two can be repeated. This can be varied for each cycle as desired.

Next, at 114, it is determined whether the metal layer has achieved a predetermined thickness. If the predetermined thickness has not been achieved, the method 100 returns to 104 to continue forming the layer until the predetermined thickness is reached. Once the predetermined thickness has been reached, the method 100 can either end or proceed to 116 where a bulk deposition process may be performed to deposit the remaining thickness of the metal layer. In some embodiments, the bulk deposition process may be a CVD process. Upon completion of deposition of the metal layer to a desired thickness, the method 100 generally ends and the substrate can proceed for any further processing. For example, in some embodiments, a CVD process may be performed to bulk deposit the metal layer to a target thickness. For example in some embodiments, the metal layer may be deposited via ALD or CVD reaction of the metal precursor and hydrogen radicals to form a total layer thickness of about 10 to about 10,000 Å, or in some embodiments, about 10 to about 1000 Å, or in some embodiments, about 500 to about 5,000 Å.

The metal film formed in some embodiments consists essentially of the first metal. As used in this regard, the term "consists essentially of the first metal" means that the bulk portion of the film is greater than about 50%, 55%, 60%, 65%, 70%, 75%, 80%, 85%, 90%, 95% or 98% of the metal in the first reactive gas on an atomic basis. The bulk portion of the film excludes the interface regions immediately adjacent the substrate and the surface of the layer which may oxidize. In some embodiments, the metal film consists essentially of tungsten. In one or more embodiments, the metal film consists essentially of one or more of tungsten, molybdenum, niobium, vanadium, and/or chromium.

Embodiments of the disclosure provide metal films having low resistivities. As used in this regard, "low resistivity" means less than 250 μΩ-cm. In some embodiments, the metal film has a resistivity less than 225, 200, 175, 150, 125, 100, 75 or 50 μΩ-cm. In some embodiments, the metal film is a tungsten film with a resistivity less than 250, 225, 200, 175, 150, 125, 100, 75 or 50 µΩ-cm.

The temperature throughout the process of FIG. 1, up to, and in some embodiments including, the bulk deposition at 116, occurs at substantially the same temperature. As used in this regard, the term "substantially the same temperature" means that the substrate temperature remains within ±50° C., ±25° C., ±15° C., ±10° C. or ±5° C. during exposure of each of the nucleation promoter, the first reactive gas and the second reactive gas. Thus, the pretreatment and deposition processes of 103 and 104 can occur without changing processing chamber or processing conditions.

The processing temperature during the deposition of the metal film can be any suitable temperature. In some embodiments, the process temperature is in the range of about 50° C. to about 650° C., or in the range of about 100° C. to about 600° C., or in the range of about 300° C. to about 600° C., or in the range of about 400° C. to about 600° C., or in the range of about 450° C. to about 575° C., or in the range of about 475° C. to about 550° C.

Some embodiments of the disclosure are directed to integrated circuit transistor devices comprising a dielectric layer disposed over a channel, a discontinuous seed layer comprising a nucleation promotor on the dielectric layer. The seed layer having an average thickness less than or equal to about 1.5 Å or 1.0 Å. A fill layer is disposed over the dielectric layer. In some embodiments, the fill layer consists essentially of a substantially pure (greater than about 90 atomic %) metal. In some embodiments, the fill layer consists essentially of tungsten.

Some embodiments of the disclosure are directed to tungsten containing films. These films include, tungsten metal films, tungsten nitrides, silicide and tungsten silicon nitride. The tungsten containing films can be used for any number of suitable purposes including, but not limited to, p-metal work function layers and fill materials.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

EXAMPLES

A substrate was heated to approximately 480° C. to 550° C. under an inert atmosphere of 10-40 Torr. Tungsten (VI) oxychloride, $WOCl_4$, vapor was introduced in sufficient partial pressure and duration to saturate the substrate surface. An inert gas purge removed the $WOCl_4$ vapor. Hydrogen gas was introduced in sufficient pressure and duration to react with the metal chlorides on the substrate surface. The hydrogen chloride byproduct was removed by an inert gas purge, and a W metal film remained. The process was repeated, with the number of cycles necessary to build a W metal film of the predetermined thickness.

Tungsten films were deposited by ALD with $WCl_5$ and $WOCl_4$ as a tungsten precursor and hydrogen as a reductant. A 0.1 second pulse of trimethylaluminum was used as a nucleation layer on 1000 Å $SiO_2$. The resistivities of the resulting films were measured. The $WCl_5$ film had a thickness of about 256 Å and a resistivity of 135 µΩ-cm. The $WOCl_4$ film had a thickness of about 234 Å and a resistivity of 140 µΩ-cm.

For highly structures substrates it might be useful to maintain a higher partial pressure of the precursor, in order that surface saturation may be achieved more quickly.

$WCl_4O$ has a vapor pressure about ten times higher than the $WCl_5$ currently in use. Without being bound by any particular theory of operation, it is believed that because the precursor is already partially oxidized, there is less chemical driving force to react with the surface oxides of the reactor hardware, so the burn-in period for a new ampoule may be reduced.

Figure 2:
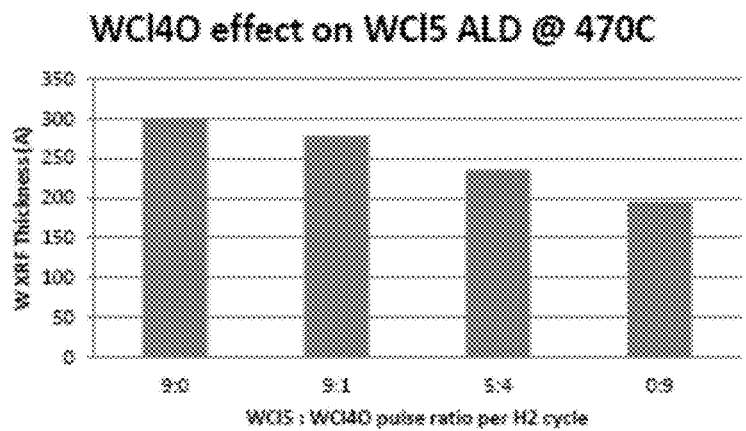
Figure 3:
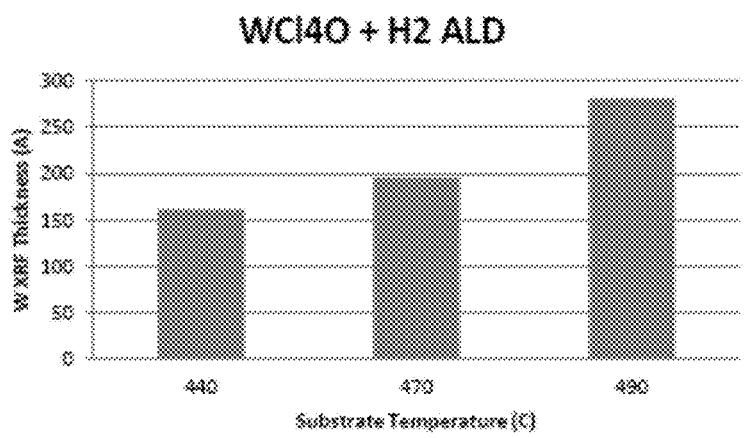
FIG. 3 shows a graph of the film thickness as a function of substrate temperature for samples prepared in accordance with one or more embodiment of the disclosure.

Samples were prepared using mixtures of tungsten oxychloride ALD cycles and tungsten pentachloride ALD cycles in various ratios of cycle number, from pure oxychloride ALD to pure pentachloride ALD. The thickness of the films after a fixed number of cycles was measured. FIG. 2 shows a graph of the tungsten thickness as measured by XRF as a function of the $WCl_5$:$WOCl_4$ cycle ratio, which indicates the GPC (growth per cycle) using tungsten oxychloride is about two third of GPC using tungsten pentachloride for ALD tungsten Tungsten films were deposited using pure $WOCl_4$ at various temperatures. FIG. 3 shows the tungsten thickness after a fixed number of cycles as a function of deposition temperature. The tungsten deposition rate was observed to increase with substrate temperature.

Those skilled in the art expected that the resulting film would have too much oxygen incorporation due to the oxygen in the precursor. The inventors have surprisingly found that that films derived from $WCl_4O$ as compared to $WCl_5$ had similar resistivity. In some embodiments, it has been found that the uses of metal oxychlorides as a metal precursor are applicable to any CVD or ALD process compatible with metal chloride.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising exposing a substrate to a first reactive gas and a second reactive gas to deposit a metal film on the substrate, the substrate maintained at a temperature in the range of about 400° C. to about 600° C., the first reactive gas comprising a metal oxyhalide, the metal film having a thickness greater than or equal to about 10 Å, a resistivity less than 200 $\mu\Omega$-cm and a metal content greater than 50 atomic percent.

2. The method of claim 1, wherein the metal oxyhalide comprises one or more of a tungsten, molybdenum, niobium, vanadium and/or chromium.

3. The method of claim 1, wherein the metal oxyhalide comprises substantially no fluorine.

4. The method of claim 1, wherein the metal oxyhalide comprises a metal oxychloride.

5. The method of claim 4, wherein the metal oxychloride comprises tungsten oxychloride.

6. The method of claim 1, wherein second reactive gas comprises a hydrogen-containing compound and the metal film is a metal film.

7. The method of claim 6, wherein the hydrogen-containing compound consists essentially of molecular hydrogen.

8. The method of claim 1, wherein the second reactive gas comprises a nitrogen-containing compound and the metal film comprises a metal nitride.

9. The method of claim 8, wherein the second reactive gas comprises ammonia.

10. The method of claim 1, further comprising exposing the substrate to a nucleation promoter before or during exposing the substrate to the first reactive gas.

11. The method of claim 10, wherein the nucleation promoter is selected from the group consisting of trialkylaluminum, trialkylgallium, trialkylindium, disilane, trisilane, tetrasilane, diethylsilane, derivatives thereof and combinations thereof.

12. The method of claim 10, wherein the substrate comprises a dielectric.

13. The method of claim 12, wherein the first reactive gas comprises a metal that does not nucleate on the dielectric without the nucleation promoter.

14. The method of claim 12, wherein the nucleation promotor acts like a seed layer for formation of the metal film, the seed layer having an average thickness less than or equal to about 1.5 Å.

15. The method of claim 10, wherein exposure to the nucleation promoter occurs substantially simultaneously with a first exposure to the metal oxyhalide.

16. A processing method comprising
positioning a substrate having a dielectric surface in a processing chamber; and
sequentially exposing at least a portion of the substrate to a first reactive gas and a second reactive gas to form a tungsten film on the substrate, the substrate maintained at a temperature in the range of about 400° C. to about 600° C., the tungsten film having a thickness of greater than or equal to about 10 Å, the first reactive gas comprising a tungsten oxyhalide and the second reactive gas comprising hydrogen.

17. The processing method of claim 16, wherein the tungsten oxyhalide comprises tungsten oxychloride.

18. The method of any of claim 16, further comprising exposing the substrate to a nucleation promoter selected from the group consisting of trimalkylaluminum, trialkylgallium, trialkylindium, disilane, trisilane, tetrasilane, diethylsilane, derivatives thereof and combinations thereof.

19. The method of claim 18, wherein the tungsten oxyhalide comprises substantially no fluorine.

20. A processing method comprising
positioning a substrate having a dielectric surface in a processing chamber;
treating the dielectric surface with a nucleation promoter selected from the group consisting of trialkylaluminum, trialkylgallium, trialkylindium, disilane, trisilane, tetrasilane, diethylsilane, derivatives thereof and combinations thereof; and
sequentially exposing at least a portion of the treated dielectric surface to a first reactive gas and a second reactive gas to form a tungsten film on the substrate, the substrate maintained at a temperature in the range of about 400° C. to about 600° C., the first reactive gas comprising tungsten oxychloride and substantially no fluorine and the second reactive gas comprises hydrogen, and the tungsten film having a thickness greater than or equal to about 10 Å.

* * * * *